(12) United States Patent
Kim et al.

(10) Patent No.: US 7,919,414 B2
(45) Date of Patent: Apr. 5, 2011

(54) METHOD FOR FORMING FINE PATTERNS IN SEMICONDUCTOR DEVICE

(75) Inventors: Won-Kyu Kim, Kyoungki-do (KR); Jun-Hyeub Sun, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 630 days.

(21) Appl. No.: 12/005,546

(22) Filed: Dec. 26, 2007

(65) Prior Publication Data

US 2009/0004862 A1 Jan. 1, 2009

(30) Foreign Application Priority Data

Jun. 26, 2007 (KR) .................. 10-2007-0062812

(51) Int. Cl.
*H01L 21/302* (2006.01)
(52) U.S. Cl. .................. 438/740; 438/717; 438/736
(58) Field of Classification Search ............ 438/706, 438/710, 712, 714, 736, 740, 745, 637, 639, 438/717, 735
See application file for complete search history.

(56) References Cited

U.S. PATENT DOCUMENTS

| | | | |
|---|---|---|---|
| 5,591,301 A * | 1/1997 | Grewal | 438/729 |
| 2001/0009784 A1* | 7/2001 | Ma et al. | 438/197 |
| 2004/0236548 A1* | 11/2004 | Nakamura et al. | 703/2 |
| 2006/0003182 A1 | 1/2006 | Lane et al. | |
| 2006/0068596 A1 | 3/2006 | Dobuzinsky et al. | |
| 2006/0211260 A1 | 9/2006 | Tran et al. | |
| 2007/0049032 A1* | 3/2007 | Abatchev et al. | 438/691 |
| 2007/0161251 A1* | 7/2007 | Tran et al. | 438/725 |

FOREIGN PATENT DOCUMENTS

| | | |
|---|---|---|
| KR | 1019990027887 A | 4/1999 |
| KR | 10-2003-0002145 A | 1/2003 |
| KR | 10-2007-0051196 A | 5/2007 |

* cited by examiner

*Primary Examiner* — Lan Vinh
(74) *Attorney, Agent, or Firm* — Blakely, Sokoloff, Taylor & Zafman

(57) ABSTRACT

A method for forming fine patterns in a semiconductor device includes forming an etch stop layer and a sacrificial layer over an etch target layer, forming photoresist patterns over the sacrificial layer, etching the sacrificial layer by using the photoresist patterns as an etch barrier to form sacrificial patterns, forming spacers on both sidewalls of the sacrificial patterns, removing the sacrificial patterns, and etching the etch stop layer and the etch target layer by using the spacer as an etch barrier.

16 Claims, 5 Drawing Sheets

METHOD FOR FORMING FINE PATTERNS IN SEMICONDUCTOR DEVICE

CROSS-REFERENCE TO RELATED APPLICATIONS

The present invention claims priority of Korean patent application number 2007-0062812, filed on Jun. 26, 2007, which is incorporated by reference in its entirety.

BACKGROUND OF THE INVENTION

The present invention relates to a method for fabricating a semiconductor device, and more particularly, to a method for fabricating fine patterns in a semiconductor device.

As a semiconductor device has been highly integrated, a scaling-down of patterns is required. However, a resolution of a typical photo-exposure apparatus has a limitation to embody fine patterns under 40 nm in a semiconductor device.

Thus, a double patterning method which performs a photolithography process twice is suggested to form the fine patterns. Hereinafter, the double patterning method will be described referring to FIGS. 1A to 1D.

FIGS. 1A to 1D are cross-sectional views of a method for forming typical fine patterns.

Referring to FIG. 1A, a first hard mask layer 11 and a second hard mask layer 12 are sequentially formed over an etch target layer 10.

A photoresist layer is coated over the second hard mask layer 12. The first photoresist layer is patterned by using a photo-exposure and a development process to form first photoresist patterns 13. The first photoresist patterns 13 may have a linewidth corresponding to exposure limitations.

Referring to FIG. 1B, the second hard mask layer 12 is etched by using the first photoresist patterns 13 as an etch barrier to form second hard mask patterns 12A. The first photoresist patterns 13 are removed during forming the second photoresist patterns 12A or separately removed by the subsequent process.

Referring to FIG. 1C, a second photoresist layer is coated over a resultant surface including the second hard mask patterns 12A. The second photoresist layer is patterned using a photo-exposure and a development process to form second photoresist patterns 14. The second photoresist patterns 14 may also have a linewidth corresponding to exposure limitations.

Referring to FIG. 1D, the hard mask layer 11 is etched by using the second hard mask patterns 12A and the second photoresist patterns 14 as an etch barrier to form first hard mask patterns 11A. The second hard mask patterns 12A and the second photoresist patterns 14 are removed during forming the first hard mask patterns 11A or separately removed by the subsequent process.

Although it is not shown, the etch target layer 10 is etched by using the first hard mask patterns 11A as an etch barrier to form etch target patterns.

As above, since the etch target patterns are formed by performing the photolithography process twice, etch target patterns having a fine linewidth are formed despite limitations of a photo-exposure apparatus.

The double patterning method has a limitation described below.

To secure a linewidth uniformity of the etch target patterns, an overlay accuracy of the first photoresist patterns 13 and the second photoresist patterns 14 should be secured. In other words, the second photoresist patterns 14 should be formed to divide a space between the first photoresist patterns 13 into two. However, the typical photo-exposure apparatus cannot accurately control the positions of the first and second photoresist patterns. Also, performing the photolithography process twice causes a cost increase.

SUMMARY OF THE INVENTION

Embodiments of the present invention are directed to provide a method for forming fine patterns in a semiconductor device.

The method for forming the fine patterns can form fine patterns like those formed with a double patterning method by performing a photolithography process one time. Thus, it is possible to secure a uniformity of a pattern linewidth and reduce a cost.

In accordance with an aspect of the present invention, there is provided a method for forming fine patterns in a semiconductor device. The method includes forming an etch stop layer and a sacrificial layer over an etch target layer, forming photoresist patterns over the sacrificial layer, etching the sacrificial layer by using the photoresist patterns as an etch barrier to form sacrificial patterns, forming spacers on both sidewalls of the sacrificial patterns, removing the sacrificial patterns, and etching the etch stop layer and the etch target layer by using the spacer as an etch barrier.

In accordance with another aspect of the present invention, there is provided a method for forming fine patterns in a semiconductor device. The method includes forming an etch stop layer and a sacrificial layer over an etch target layer, forming photoresist patterns over the sacrificial layer, etching the sacrificial layer by using the photoresist patterns as an etch barrier to form sacrificial patterns, forming spacers on both sidewalls of the sacrificial patterns, forming a first material layer including a material used for the etch stop layer to have a thickness sufficient to compensate for portions of the etch stop layer which are lost when forming the spacers, forming a second material layer including a material used for the sacrificial layer over the first material layer to have a thickness sufficient to cover the sacrificial patterns, performing a planarization process until the sacrificial patterns are exposed, removing the sacrificial patterns and the second material layer, and etching the etch stop layer and the etch target layer using the spacers as an etch barrier to form etch target patterns having a fine linewidth.

In accordance with another aspect of the present invention, there is provided a method for forming fine patterns in a semiconductor device. The method includes forming a hard mask layer, an etch stop layer and a sacrificial layer over an etch target layer, forming photoresist patterns over the sacrificial layer, etching the sacrificial layer by using the photoresist patterns as an etch barrier to form sacrificial patterns, forming spacers on both sidewalls of the sacrificial patterns, removing the sacrificial patterns, etching the etch stop layer by using the spacers as an etch barrier to form etch stop patterns, etching the hard mask layer and the etch target layer by using the etch stop patterns as an etch barrier to form etch target patterns having a fine linewidth.

DESCRIPTION OF SPECIFIC EMBODIMENTS

Embodiments of the present invention relate to a method for forming fine patterns in a semiconductor device.

FIGS. 2A to 2F are cross-sectional views of a method for forming fine patterns in a semiconductor device in accordance with a first embodiment of the present invention.

Figure 1A:
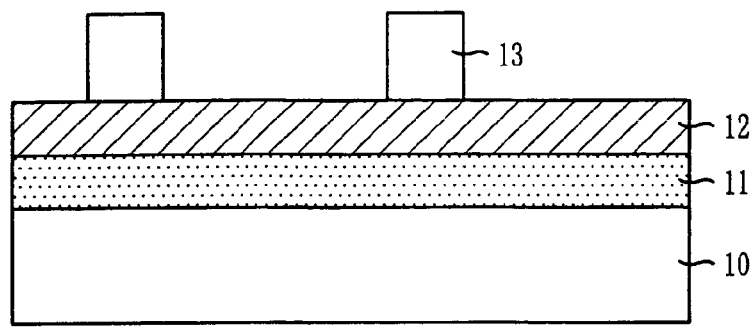
FIGS. 1A to 1D are cross-sectional views of a method for forming fine patterns in a typical semiconductor device.
Figure 1B:
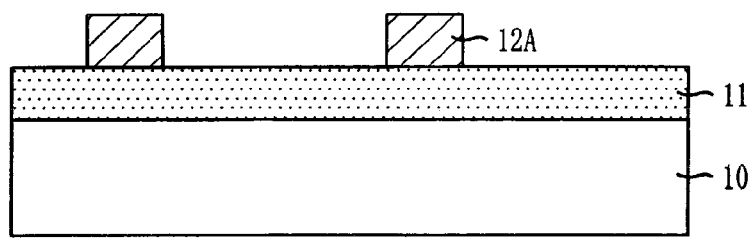
Figure 1C:
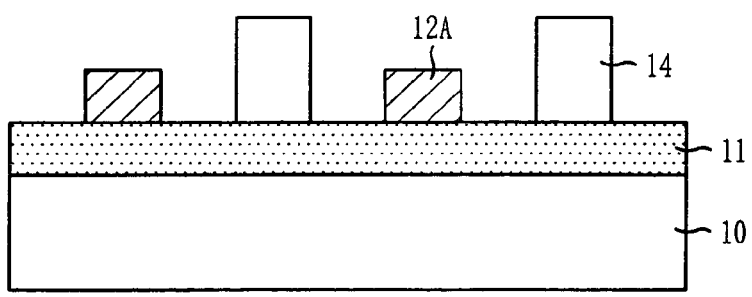
Figure 1D:
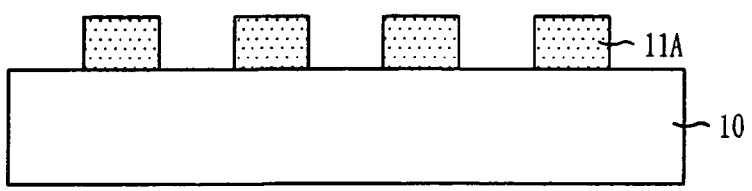
Figure 2A:
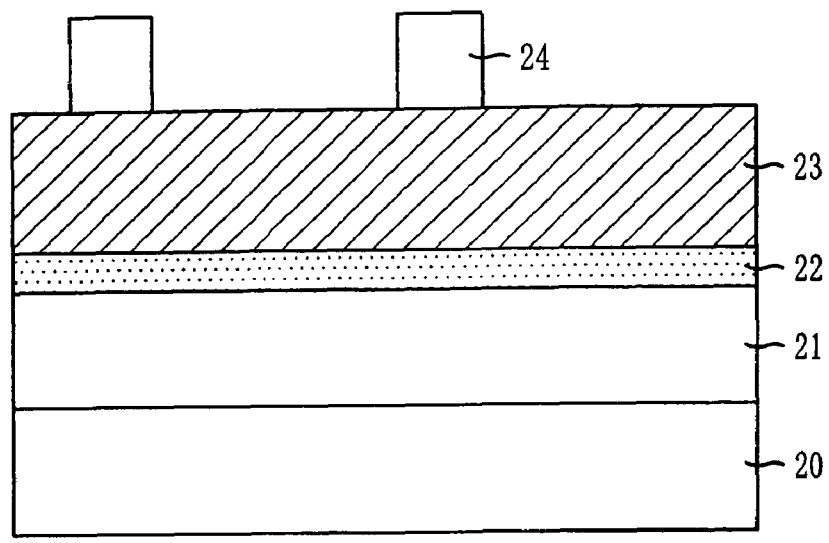
FIGS. 2A to 2F are cross-sectional views of a method for forming fine patterns in a semiconductor device in accordance with a first embodiment of the present invention.

Referring to FIG. 2A, a hard mask layer 21 is formed over an etch target layer 20. The hard mask layer 21 is used as an etch barrier during subsequent etching of the etch target layer 20. The hard mask layer 21 can be omitted when needed.

An etch stop layer 22 is formed over the hard mask layer 21. The etch stop layer 22 includes a nitride layer or a silicon oxy-nitride (SiON) layer or both. The etch stop layer 22 is formed to stop the etching during forming the subsequent sacrificial layer and/or forming the subsequent spacer. Furthermore, the etch stop layer 22 is used as an etch barrier when etching the hard mask layer 21.

A sacrificial layer 23 is formed over the etch stop layer 22. The sacrificial layer 23 has a thickness to secure an etch margin when etching a lower layer, i.e., the etch stop layer 22. It is preferable to have a thickness of from approximately 500 Å to approximately 5,000 Å. Since the sacrificial layer 23 should be removed by the subsequent process, it is preferable to include a material which is easily removed by a wet or dry-removal process. In detail, the sacrificial layer 23 includes a tetraethylorthosilicate (TEOS), a high aspect ratio process (HARP), a spin on dielectric (SOD) or a spin on glass (SOG) layer which is easily removed. The sacrificial layer 23 also includes a polysilicon layer or an amorphous carbon layer.

A photoresist layer is coated over the sacrificial layer 23 to form photoresist patterns 24 using a photo-exposure and development process. At this time, it is preferable that the photoresist patterns 24 have a ratio of a line to a space in a range of approximately 1:2.5 to 1:3.5. Although it is not shown, an anti-reflection layer may be formed below the photoresist patterns 24.

Figure 2B:
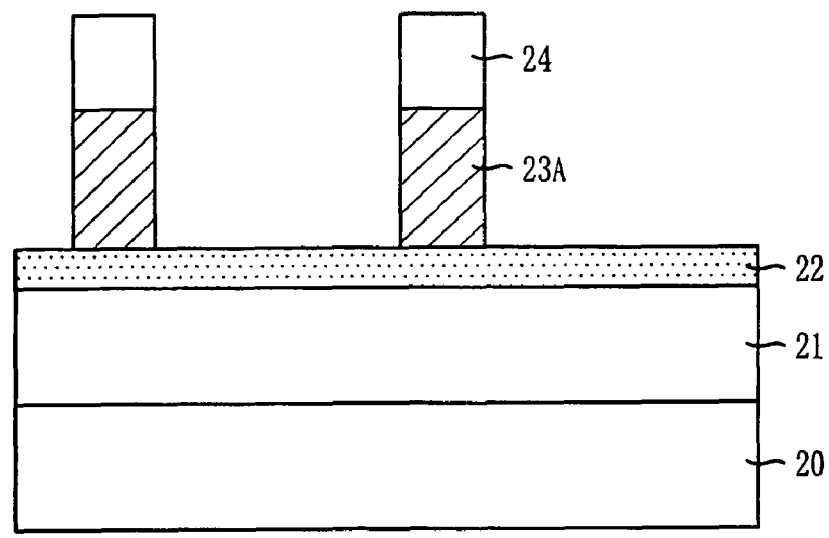

Referring to FIG. 2B, the sacrificial layer 23 is etched using the photoresist patterns 24 as an etch barrier to form sacrificial patterns 23A. Although it is not shown, another hard mask layer can be formed between the photoresist patterns 24 and the sacrificial layer 23 so that the sacrificial layer 23 is etched. Thus, a pattern failure such as a deformation of the sacrificial patterns 23A is generated when etching the sacrificial layer 23. The sacrificial layer 23 is etched by using the photoresist patterns 24 as an etch barrier.

Figure 2C:
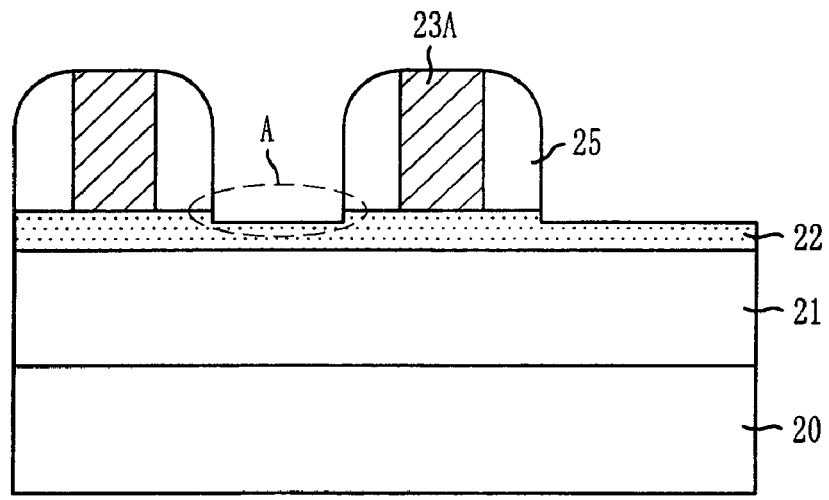

Referring to FIG. 2C, after removing the photoresist patterns 24, a material layer for spacers is deposited on a resultant surface including the sacrificial patterns 23A. The material layer for the spacer is spacer-etched to form spacers 25 on both sidewalls of the sacrificial patterns 23A.

The spacers 25 are used as an etch barrier when etching the subsequent etch target patterns. Thus, a material having a relatively high step coverage, e.g., a step coverage larger than approximately 0.9, is used as a material layer for the spacers. Also, the deposition of the material layer for the spacers is performed by using a method having an excellent step coverage characteristic, e.g., an atomic layer deposition (ALD) method.

The spacer-etch process is performed using an etch gas having a high etch rate to the etch stop layer 22 to minimize an attack to the lower etch stop layer 22.

Figure 2D:
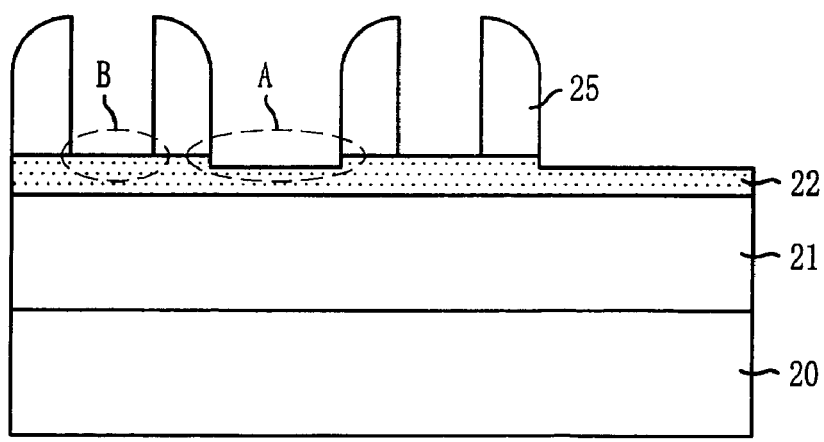

Referring to FIG. 2D, the sacrificial patterns 23A are removed using a wet or a dry-removal process. Particularly, the sacrificial patterns 23A are removed as a result of the high etch rate to the lower etch stop layer 22. For instance, in case the sacrificial patterns 23A include the TEOS, the HARP, the SOD or the SOG layers and the etch stop layer 22 includes a nitride layer, it is possible to remove the sacrificial patterns 23A by performing a wet-removal process using hydrogen fluoride (HF) or buffered oxide etchant (BOE) chemicals. Meanwhile, in case the sacrificial patterns 23A include an amorphous carbon layer, the sacrificial layer 23A can be removed by a dry removal process using a N2/O2 gas. Or, in case the sacrificial layer 23A includes the polysilicon layer, the sacrificial layer 23A can be removed by a dry-removal process using a hydrogen bromide (HBr) gas.

Figure 2E:
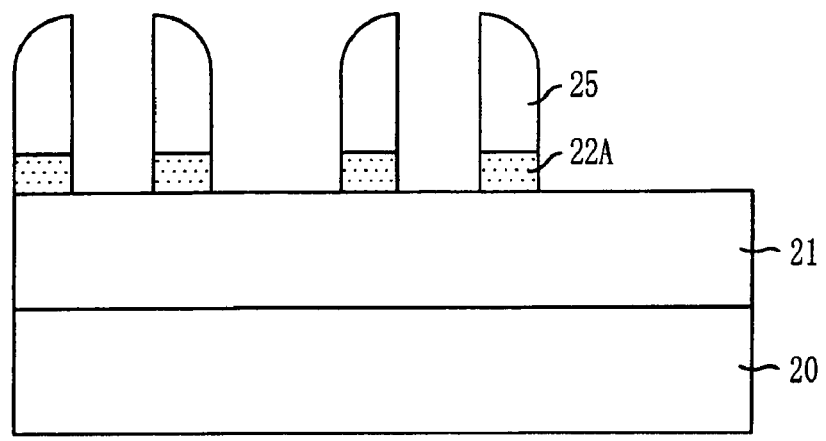

Referring to FIG. 2E, the etch stop layer 22 is etched using the spacers as an etch barrier to form etch stop patterns 22A.

Figure 2F:
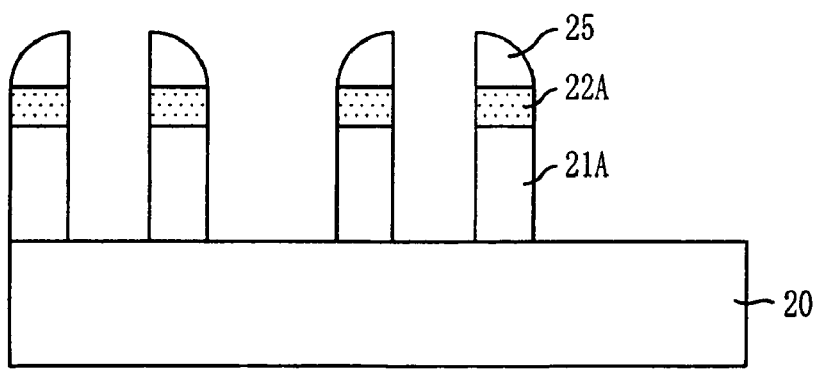

Referring to FIG. 2F, the hard mask layer 21 is etched using the etch stop patterns 22A to form hard mask patterns 21A.

Although it is not shown, the etch target layer 20 is etched using the hard mask patterns 21A as an etch barrier to form etch target patterns having a fine linewidth.

The etch target patterns are formed by using the spacers 25 self-aligned on both sidewalls of the sacrificial patterns 23A. Thus, by performing a photolithography process one time, it is possible to form the etch target patterns having fine a linewidth and also prevent an overlay and a cost increase from occurring when employing a typical double patterning process.

Figure 3A:
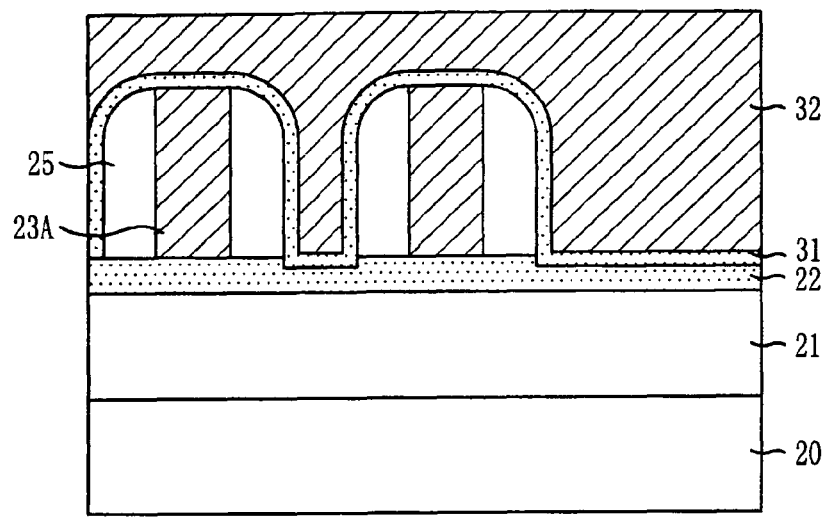
FIGS. 3A to 3C are cross-sectional views of a method for forming fine patterns in a semiconductor device in accordance with a second embodiment of the present invention.
Figure 3B:
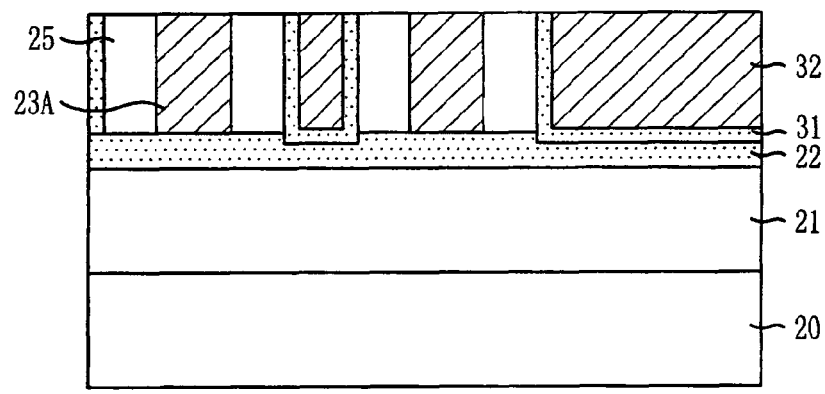
Figure 3C:
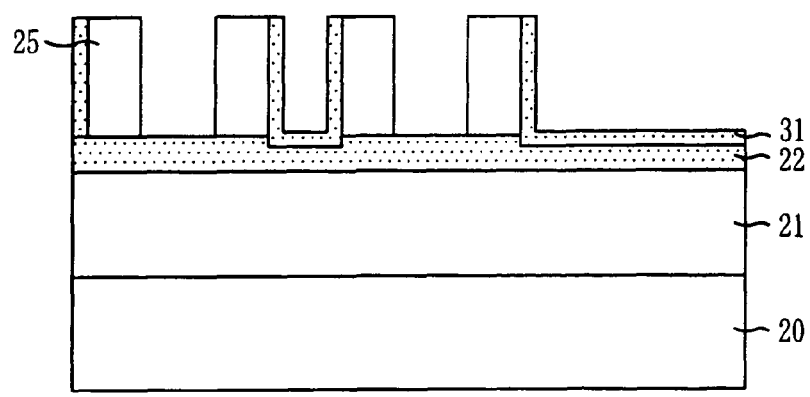

FIGS. 3A to 3C are cross-sectional views of a method for forming fine patterns in a semiconductor device in accordance with a second embodiment of the present invention. Particularly, processes illustrated in FIGS. 3A to 3C result from an improvement of the method in accordance with the first embodiment of the present invention. In detail, the processes in FIGS. 3A to 3C are performed between the process shown in FIG. 2C and that in FIG. 2E. The same or like reference numerals throughout the various embodiments of the present invention represent the same or like elements.

Referring back to FIG. 2C, the spacers 25 are formed on both sidewalls of the sacrificial patterns 23A. As described, when performing the spacer-etch to form the spacer 25, an etch gas having a high etch rate to the etch stop layer 22 is used to minimize an attack to the etch stop layer 22. However, even though the spacer is etched in the above condition, the etch stop layer 22 is damaged in a certain degree ('A' in FIG. 2C). Referring back to FIG. 2D, when the sacrificial patterns 23A are removed, a height difference is generated between a portion 'B' of the etch stop layer 22 where the sacrificial patterns 23A were and a portion of the etch stop layer 22 damaged during the spacer-etch process. The height difference in the etch stop layer 22 makes it difficult to keep a linewidth uniformly of the etch stop patterns 22A generated when the subsequent etch stop layer 22 is etched. Thus, the linewidth uniformity of the etch target layer 20 is not easily secured. It is preferable to additively perform the processes in FIGS. 3A to 3C and after the process in FIG. 2C and that in FIG. 2E.

Referring to FIG. 3A, a first material layer 31 including a material used for the etch stop layer 22, e.g., a nitride layer, is formed over a resultant structure including the etch stop layer 22 which was damaged during the spacer-etch process. The first material layer 31 is formed to have a thickness as much as the damage of the etch stop layer 22.

Referring to FIG. 3B, a chemical mechanical polishing (CMP) process is performed until the sacrificial patterns 23A are exposed.

Referring to FIG. 3C, the exposed sacrificial patterns 23A are removed. The removal of the sacrificial patterns 23A are performed in a same way used in the process in the FIG. 2D. When the sacrificial patterns 23A are removed, the second material layer 32 including the material used for the sacrificial patterns 23A are removed.

The subsequent process is same as the processes in FIGS. 2E to 2F.

As above, trough the process in FIGS. 3A to 3C, the damage of the etch stop layer 22 is compensated by the first material layer 31. The sacrificial patterns 23A and the second material layer 32 are removed at once, and thus there is no height difference in the etch stop layer 22.

The method for forming fine patterns in a semiconductor device in accordance with the present invention can form fine patterns which a double patterning method can form, thereby securing a pattern linewidth and reducing a cost.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for forming fine patterns in a semiconductor device, the method comprising:
    forming an etch stop layer and a sacrificial layer over an etch target layer;
    forming photoresist patterns over the sacrificial layer;
    etching the sacrificial layer by using the photoresist patterns as an etch barrier to form sacrificial patterns;
    forming spacers on both sidewalls of the sacrificial patterns;
    forming a first material layer including a material used for the etch stop layer to have a thickness to sufficiently compensate for portions of the etch stop layer which are lost when forming the spacers;
    forming a second material layer including a material used for the sacrificial layer over the first material layer to have a thickness sufficient to cover the sacrificial patterns;
    performing a planarization process until the sacrificial patterns are exposed;
    removing the sacrificial patterns and the second material layer; and
    etching the etch stop layer and the etch target layer by using the spacer as an etch barrier to form etch target patterns having a fine linewidth.

2. The method of claim 1, wherein a first hard mask layer is formed between the etch target layer and the etch stop layer.

3. The method of claim 1, wherein the etch stop layer includes a nitride layer or a silicon oxynitride (SiON) layer.

4. The method of claim 1, wherein the sacrificial layer has a thickness of approximately 500 Å to approximately 2,000 Å.

5. The method of claim 1, wherein the photoresist patterns have a ratio of a line to a space in a range of approximately 1:2.5 to approximately 1:3.5.

6. The method of claim 1, wherein a second hard mask layer is formed between the sacrificial layer and the photoresist patterns.

7. The method of claim 1, wherein forming the spacers comprises:
    forming a material layer for spacers over a resultant structure including the sacrificial patterns; and
    spacer-etching the material layer for the spacers.

8. The method of claim 7, wherein the material layer for spacers has a step coverage larger than approximately 0.9.

9. The method of claim 7, wherein depositing the material for spacers is performed using an atomic layer deposition (ALD) method.

10. The method of claim 7, wherein the spacer-etching is performed by using a gas having a high etch rate to the etch stop layer.

11. The method of claim 1, wherein the sacrificial layer includes a tetraethylorthosilicate (TEOS), a high aspect ratio process (HARP), a spin on dielectric (SOD) or a spin on glass (SOG) layer.

12. The method of claim 1, wherein removing the sacrificial patterns comprises performing a wet-removal process using a high etch rate to the etch stop layer.

13. The method of claim 12, wherein the wet-removal process is performed using hydrogen fluoride (HF), buffered oxide etchant (BOE) chemicals or both.

14. The method of claim 1, wherein the sacrificial patterns include a polysilicon layer or an amorphous carbon layer.

15. The method of claim 1, wherein removing the sacrificial patterns comprises performing a dry-removal process using a high etch rate to the etch stop layer.

16. The method of claim 15, wherein the dry-removal process comprises performing using a gas mixture of $N_2/O_2$ gas or a HBr gas.

* * * * *